United States Patent
Hwang (10) Patent No.: US 7,492,796 B2
(45) Date of Patent: Feb. 17, 2009

(54) METHOD AND APPARATUS FOR AUTOMATICALLY CONTROLLING A POWER OF A LASER DIODE

(75) Inventor: Hong-gie Hwang, Seoul (KR)

(73) Assignee: Samsung Electronics Co., Ltd., Suwon-Si (KR)

( * ) Notice: Subject to any disclaimer, the term of this patent is extended or adjusted under 35 U.S.C. 154(b) by 852 days.

(21) Appl. No.: 10/646,923

(22) Filed: Aug. 25, 2003

(65) Prior Publication Data

US 2004/0057476 A1  Mar. 25, 2004

(30) Foreign Application Priority Data

Aug. 26, 2002  (KR) .................. 10-2002-0050525

(51) Int. Cl.
*H01S 3/13* (2006.01)

(52) U.S. Cl. .................. 372/29.02; 372/29.021; 372/38.02; 372/38.07; 372/38.01

(58) Field of Classification Search ............. 372/29.02, 372/29.021, 38.1, 38.01, 38.02, 29.221
See application file for complete search history.

(56) References Cited

U.S. PATENT DOCUMENTS

| | | | | |
|---|---|---|---|---|
| 4,237,427 A | * | 12/1980 | Holland | 372/29.02 |
| 4,577,320 A | * | 3/1986 | Yoshikawa et al. | 372/29.012 |
| 4,611,270 A | * | 9/1986 | Klauminzer et al. | 700/78 |
| 4,774,710 A | * | 9/1988 | Davis et al. | 372/9 |
| 5,184,578 A | * | 2/1993 | Quinn et al. | 123/90.17 |
| 5,222,072 A | * | 6/1993 | Oku | 372/31 |
| 5,276,781 A | * | 1/1994 | Chang et al. | 358/1.17 |
| 5,701,283 A | * | 12/1997 | Alon et al. | 369/44.41 |
| 5,754,577 A | * | 5/1998 | Casper et al. | 372/38.07 |
| 5,966,159 A | * | 10/1999 | Ogasawara | 347/133 |
| 6,151,344 A | * | 11/2000 | Kiely et al. | 372/38.02 |
| 6,229,833 B1 | * | 5/2001 | Noda et al. | 372/38.09 |
| 6,690,693 B1 | * | 2/2004 | Crowder | 372/29.02 |
| 6,775,216 B2 | * | 8/2004 | Kelly et al. | 369/53.37 |
| 7,061,951 B2 | * | 6/2006 | Fairgrieve et al. | 372/38.02 |
| 2002/0121094 A1 | * | 9/2002 | VanHoudt | 62/3.3 |
| 2003/0142706 A1 | * | 7/2003 | Kartner et al. | 372/29.02 |
| 2005/0028770 A1 | * | 2/2005 | McCabe | 123/90.17 |
| 2005/0078723 A1 | * | 4/2005 | Han et al. | 372/38.02 |
| 2005/0128281 A1 | * | 6/2005 | Gong et al. | 347/224 |
| 2006/0140231 A1 | * | 6/2006 | Han | 372/29.02 |

* cited by examiner

*Primary Examiner*—Minsun Harvey
*Assistant Examiner*—Delma R Forde
(74) *Attorney, Agent, or Firm*—Staas & Halsey LLP

(57) ABSTRACT

A method and apparatus to automatically control an output power of a laser diode, include generating an error voltage between an output voltage of the laser diode sampled during an automatic power control period and a reference voltage, and performing proportional-integral processing on the error voltage to generate a compensated control voltage and applying the compensated control voltage to the laser diode.

25 Claims, 5 Drawing Sheets

METHOD AND APPARATUS FOR AUTOMATICALLY CONTROLLING A POWER OF A LASER DIODE

CROSS-REFERENCE TO RELATED APPLICATIONS

This application claims the priority of Korean Patent Application No. 2002-50525, filed on Aug. 26, 2002, which is incorporated herein in its entirety by reference.

BACKGROUND OF THE INVENTION

1. Field of the Invention

The present invention relates to an automatic control of an output power of a laser diode, and more particularly, to a method and apparatus for automatically controlling an output power of a laser diode using a proportional-integral control.

2. Description of the Related Art

Generally, a laser printer is an apparatus to reproduce an image by writing a latent image on a photoreceptor drum according to a video signal of the image, using a laser beam emitted from a laser diode and transferring the latent image to a medium, such as paper. Here, an output power characteristic of the laser diode changes depending on an ambient temperature, which leads to a degradation of a quality of a printed result. Therefore, many methods to compensate for a variation of an output power according to a change in the ambient temperature have been studied.

Figure 1:
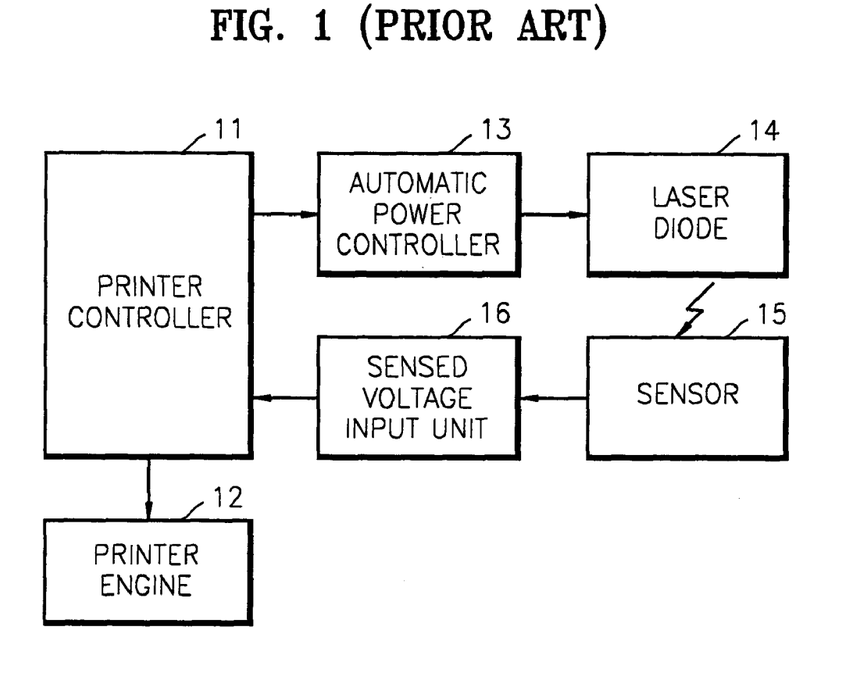
FIG. 1 is a schematic block diagram of a conventional apparatus to automatically control an output power of a laser diode.

FIG. 1 is a schematic block diagram of a conventional apparatus to automatically control the output power of the laser diode. The conventional apparatus includes a sensor 15, which senses the output power of a laser diode 14 positioned within a laser scanning unit (not shown); a sensed voltage input unit 16, which converts the sensed output power of the laser diode 14 to an appropriate form and inputs a converted result to a printer controller 11; and an automatic power controller 13, which controls the output power of the laser diode 14 using an ON/OFF method under an authorization of the printer controller 11 receiving the sensed voltage from the sensed voltage input unit 16.

In such a conventional apparatus to automatically control the output power of the laser diode, because the printer controller, the automatic power controller, and the sensed voltage input unit exist as separate blocks, a circuit occupies a wide area when implemented. Accordingly, it is difficult to manufacture a miniaturized, light, and inexpensive printer. Moreover, because the automatic power controller is realized as an analog circuit, the automatic power controller has low flexibility for feedback control. In addition, because in the ON/OFF method the amount of control performed until the output power of the laser diode has a target value varying in a range of 0-100%, the accuracy of control is low and the controlled output power of the laser diode continuously fluctuates near the target value.

SUMMARY OF THE INVENTION

The present invention provides a method of automatically controlling an output power of a laser diode to minutely approach a target value using proportional-integral control.

The present invention also provides an apparatus to automatically control an output power of a laser diode.

The present invention also provides a laser printer controller including an apparatus to automatically control the output power of the laser diode there within.

According to an aspect of the present invention, there is provided a method of automatically controlling an output power of a laser diode, the method comprising: generating an error voltage between an output voltage of the laser diode sampled during an automatic power control period and a reference voltage; and performing proportional-integral processing on the error voltage to generate a compensated control voltage and applying the compensated control voltage to the laser diode.

According to another aspect of the present invention, there is provided an apparatus to automatically control an output power of a laser diode, the apparatus including: an error voltage generation unit generating an error voltage between an output voltage of the laser diode sampled during an automatic power control period and a reference voltage; and a control voltage generation unit performing proportional-integral processing on the error voltage provided from the error voltage generation unit to generate an effective control voltage.

According to an aspect of the present invention, the error voltage generation unit includes: an analog-to-digital converter converting the output voltage of the laser diode from an analog form to a digital form; an effective output voltage extractor extracting an effective output voltage from the digital output voltage provided from the analog-to-digital converter; and a subtractor subtracting a reference voltage from the effective output voltage provided from the effective output voltage extractor to generate the error voltage.

In accordance with an aspect of the present invention, the effective output voltage extractor includes: a sampler sampling the digital output voltage provided from the analog-to-digital converter during the automatic power control period; a comparator comparing the sampled output voltage with a first maximum and a first minimum, determining whether the sampled output voltage exists within an effective range defined by the first maximum and the first minimum, and extracting the effective output voltage within the effective range; an accumulator accumulating the effective output voltage extracted by the comparator; and a divider dividing the accumulated effective output voltage by a number of accumulations to obtain an average effective output voltage.

According to still another aspect of the present invention, there is provided a laser printer controller including: an engine processor module controlling an entire operation of a printer engine; and an automatic power control module of a laser diode automatically controlling an output power of the laser diode positioned within a laser scanning unit by sampling an effective output voltage from an output power of the laser diode during a predetermined automatic power control period and performing proportional-integral processing on the effective output voltage, wherein the laser printer controller is structured in a single integrated circuit.

According to an aspect of the present invention, there is provided a printer controller controlling a laser diode and connected to a printer engine, including: an engine processor module controlling an operation of the printer engine; and an automatic power control module automatically controlling an output power of the laser diode by generating an error voltage between an output voltage of the laser diode sampled during an automatic power control period and a reference voltage, and performing proportional-integral processing on the error voltage to generate a compensated control voltage and applying the compensated control voltage to the laser diode.

According to an aspect of the present invention, there is provided a method or computer readable medium including a computer program of a printer controller controlling a laser diode and connected to a printer engine, including: controlling an operation of the printer engine; automatically controlling an output power of the laser diode by generating an error voltage between an output voltage of the laser diode sampled during an automatic power control period and a reference voltage; and performing proportional-integral processing on the error voltage to generate a compensated control voltage and applying the compensated control voltage to the laser diode.

Additional aspects and/or advantages of the invention will be set forth in part in the description which follows and, in part, will be obvious from the description, or may be learned by practice of the invention.

BRIEF DESCRIPTION OF THE DRAWINGS

The above and/or other aspects and advantages of the present invention will become more apparent by describing in detail a preferred embodiment thereof with reference to the attached drawings in which.

DETAILED DESCRIPTION OF THE INVENTION

Reference will now be made in detail to the present aspects of the present invention, examples of which are illustrated in the accompanying drawings, wherein like reference numerals refer to the like elements throughout. The aspects are described below in order to explain the present invention by referring to the figures. Hereinafter, preferred embodiments of the present invention will be described in detail with reference to the attached drawings.

Figure 2:
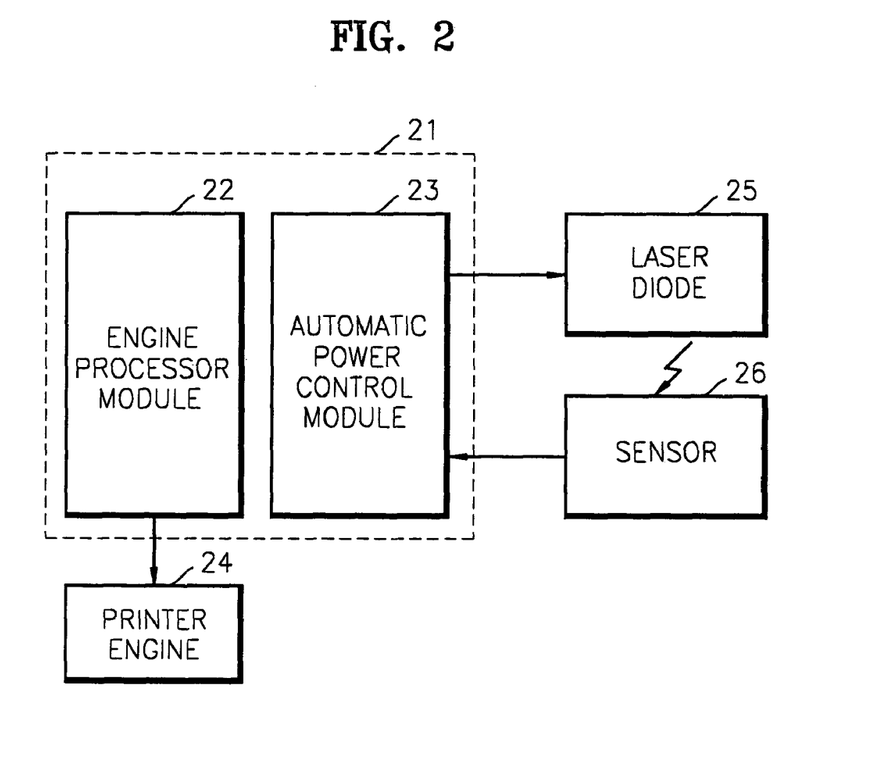
FIG. 2 is a block diagram showing a printer controller using an apparatus to automatically control the output power of the laser diode, according to an aspect of the present invention.

FIG. 2 is a block diagram showing a printer controller 21 including an automatic power control module 23 for a laser diode, according to an aspect of the present invention, and associated peripheral elements. The printer controller 21 is an integrated circuit including an engine processor module 22 and the automatic power control module 23. The engine processor module 22 controls an entire operation of a printer engine 24. The automatic power control module 23 automatically controls an output power of a laser diode 25, which is sensed by a sensor 26, to minutely approach a target value using proportional-integral control. The laser diode 25 is included within a laser scanning unit (not shown).

Figure 3:
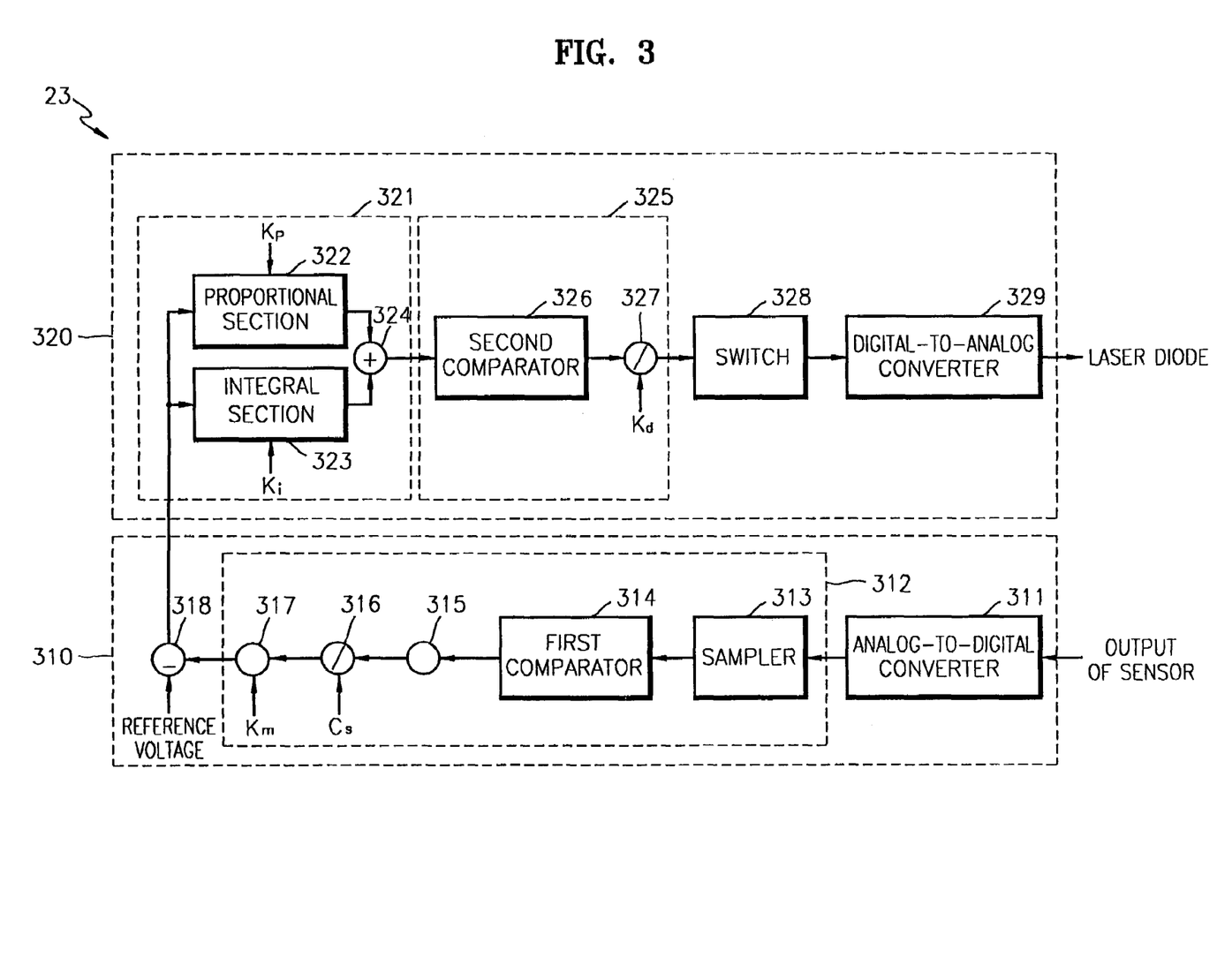
FIG. 3 is a block diagram of an apparatus to automatically control the output power of the laser diode, according to an aspect of the present invention.

FIG. 3 is a block diagram of the automatic power control module 23 shown in FIG. 2, according to an aspect of the present invention. The automatic power control module 23 includes an error voltage generation unit 310 and a control voltage generation unit 320. The error voltage generation unit 310 includes an analog-to-digital converter 311, an effective output voltage extractor 312, and a subtractor 318. The effective output voltage extractor 312 includes a sampler 313, a first comparator 314, an accumulator 315, and a first divider 316. The control voltage generation unit 320 includes a proportional-integral processor 321, an effective control voltage extractor 325, and a digital-to-analog converter 329. The proportional-integral processor 321 includes a proportional section 322, an integral section 323, and an adder 324. The effective control voltage extractor 325 includes a second comparator 326. In the meantime, in order to simplify a decimal point calculation, the effective output voltage extractor 312 further includes a multiplier 317, and the effective control voltage extractor 325 further includes a second divider 327.

The error voltage generation unit 310 generates an error voltage between an output voltage of the laser diode 25 (FIG. 2), which is extracted for a duration of an automatic power control set to have a predetermined period, and a reference voltage.

More specifically, the analog-to-digital converter 311 converts a voltage of the output power of the laser diode 25 to a digital output voltage. The sampler 313 samples the digital output voltage received from the analog-to-digital converter 311 during an automatic power control period. In another aspect of the present invention, the sampler 313 can set the automatic power control period and control the analog-to-digital converter 311 to perform a conversion only during the automatic power control period. In addition, the sampler 313 can set a number of samplings during the automatic power control period. In this case, the sampler 313 performs the set number of samplings on the digital output voltage received from the analog-to-digital converter 311.

The first comparator 314 previously sets a first maximum and a first minimum to define an effective range of the digital output voltage of the laser diode 25, compares the first maximum and the first minimum with the sampled digital output voltage received from the sampler 313, and determines whether the sampled digital output voltage exists within the effective range. As the result of the determination, the first comparator 314 outputs only an effective output voltage within the effective range to the accumulator 315 and increases a number of accumulations Cs by 1 whenever outputting the effective output voltage to the accumulator 315. The first maximum and the first minimum are set in order to take only normal components from the output power of the laser diode 25 except for error components and obtained through experiments.

The accumulator 315 accumulates the effective output voltage provided from the first comparator 314. The first divider 316 divides an accumulated result output from the accumulator 315 by a number of accumulations Cs to calculate an average effective output voltage. The multiplier 317 multiplies the average effective output voltage received from the first divider 316 by a predetermined multiplication constant Km in order to simplify a decimal point calculation in the proportional-integral processor 321 and outputs a multiplied result to the subtractor 318. The subtractor 318 subtracts the reference voltage, i.e., a control target value for the laser diode, from the multiplied result received from the multiplier 317 to generate the error voltage.

Furthermore, the control voltage generation unit 320 performs a proportional-integral processing on the error voltage received from the error voltage generation unit 310 to generate a compensated control voltage and applies the compensated control voltage to the laser diode 25.

More specifically, in the proportional-integral processor 321, the proportional section 322 multiplies the error voltage by a proportional constant Kp to generate a proportional term. The integral section 323 accumulates the error voltage and multiplies the accumulated error voltage by an integral constant Ki to generate an integral term. The adder 324 adds up the proportional term and the integral term and outputs a result of the addition. The proportional constant Kp and the integral constant Ki are optimal values selected from the results of an actual control using a cut-and-try method. The proportional-integral processor 321 can add a single sign bit to the output of the subtractor 318 in order to simplify a proportional-integral processing because a negative value may be generated as a result of the subtraction from the subtractor 318.

In the effective control voltage extractor 325, the second comparator 326 previously sets a second maximum and a second minimum which define an effective range of a control voltage for the laser diode 25, compares the proportional-integral processed error voltage, i.e., a control voltage received from the proportional-integral processor 321 with the second maximum and the second minimum, and determines whether the control voltage exists within the effective range. As a result of the determination, only an effective control voltage within the effective range is output to the second divider 327. When the control voltage is beyond the effective range, the control voltage is ignored, and the second comparator 326 waits until another control voltage obtained during the next automatic power control period is received from the proportional-integral processor 321.

The second divider 327 divides the effective control voltage received from the second comparator 326 by a division constant Kd and outputs the divided effective control voltage to the switch 328. Here, the division constant Kd may be the same as the multiplication constant Km, in accordance with an aspect of the present invention. The division constant Kd and the multiplication constant Km can be obtained through experiments.

The switch 328 switches the output of the effective control voltage provided from the second divider 327. When different types of automatic power control modules 23, such as one using an ON/OFF method and one using a proportional-integral control method, are implemented in a single circuit, the switch 328 is operated according to a user's selection so as to provide the effective control voltage from the second divider 327 to the digital-to-analog converter 329. The digital-to-analog converter 329 converts the effective control voltage provided from the switch 328 to an analog form and applies the converted effective control voltage to the laser diode 25.

Figure 4:
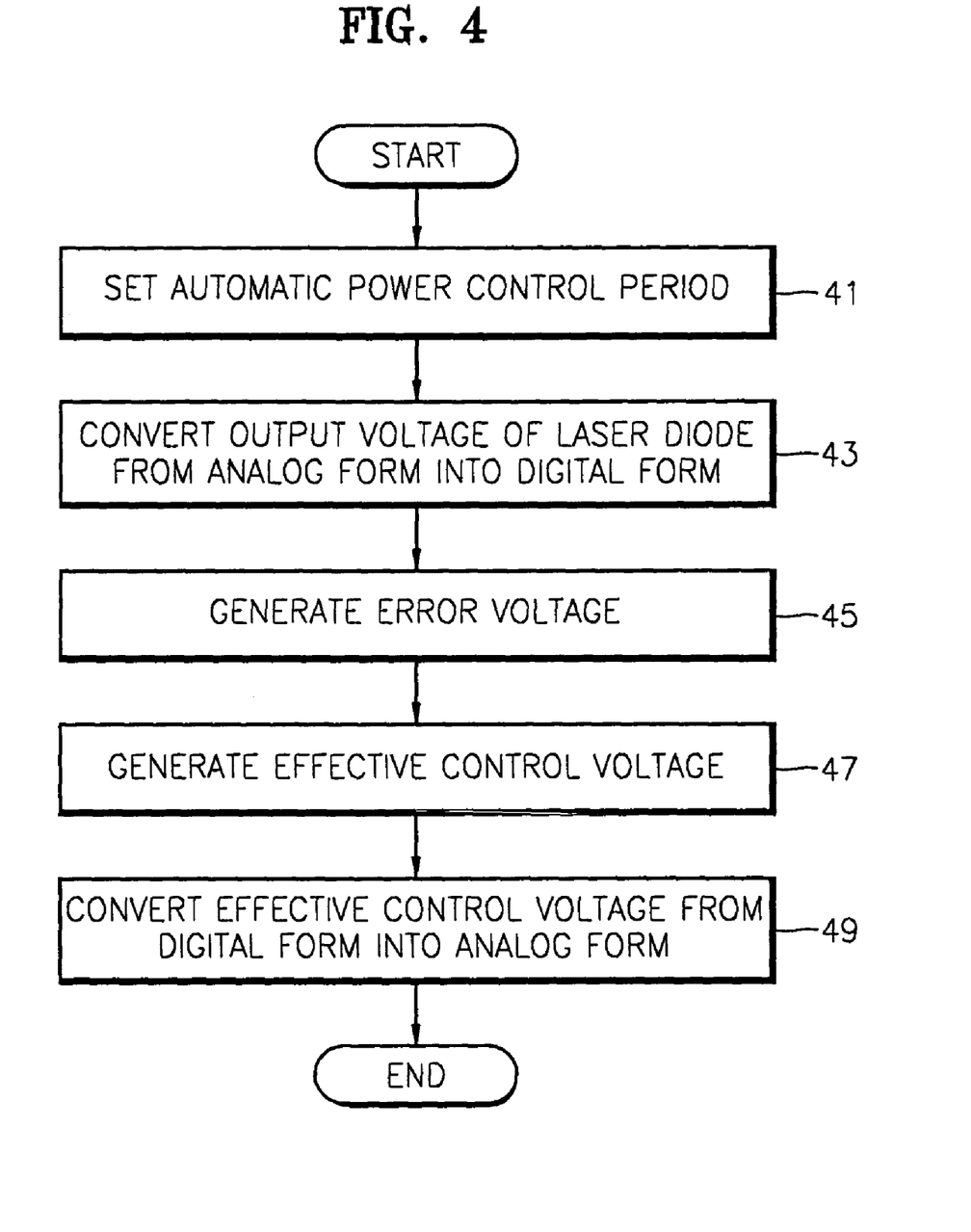
FIG. 4 is a flowchart of a method of automatically controlling the output power of the laser diode, according to an aspect of the present invention.

FIG. 4 is a flowchart of a method of automatically controlling the output power of the laser diode 25, according to an aspect of the present invention. Referring to FIG. 4, at operation 41, the automatic power control period for the laser diode 25 is set. At operation 43, the output voltage of the laser diode 25 is converted from an analog form to a digital form.

At operation 45, the digital output voltage of the laser diode 25 is sampled during the automatic power control period, and the error voltage between the effective output voltage extracted from sampled digital output voltages and the reference voltage is generated. Operation 45 will be described in detail with reference to FIG. 5.

Figure 5:
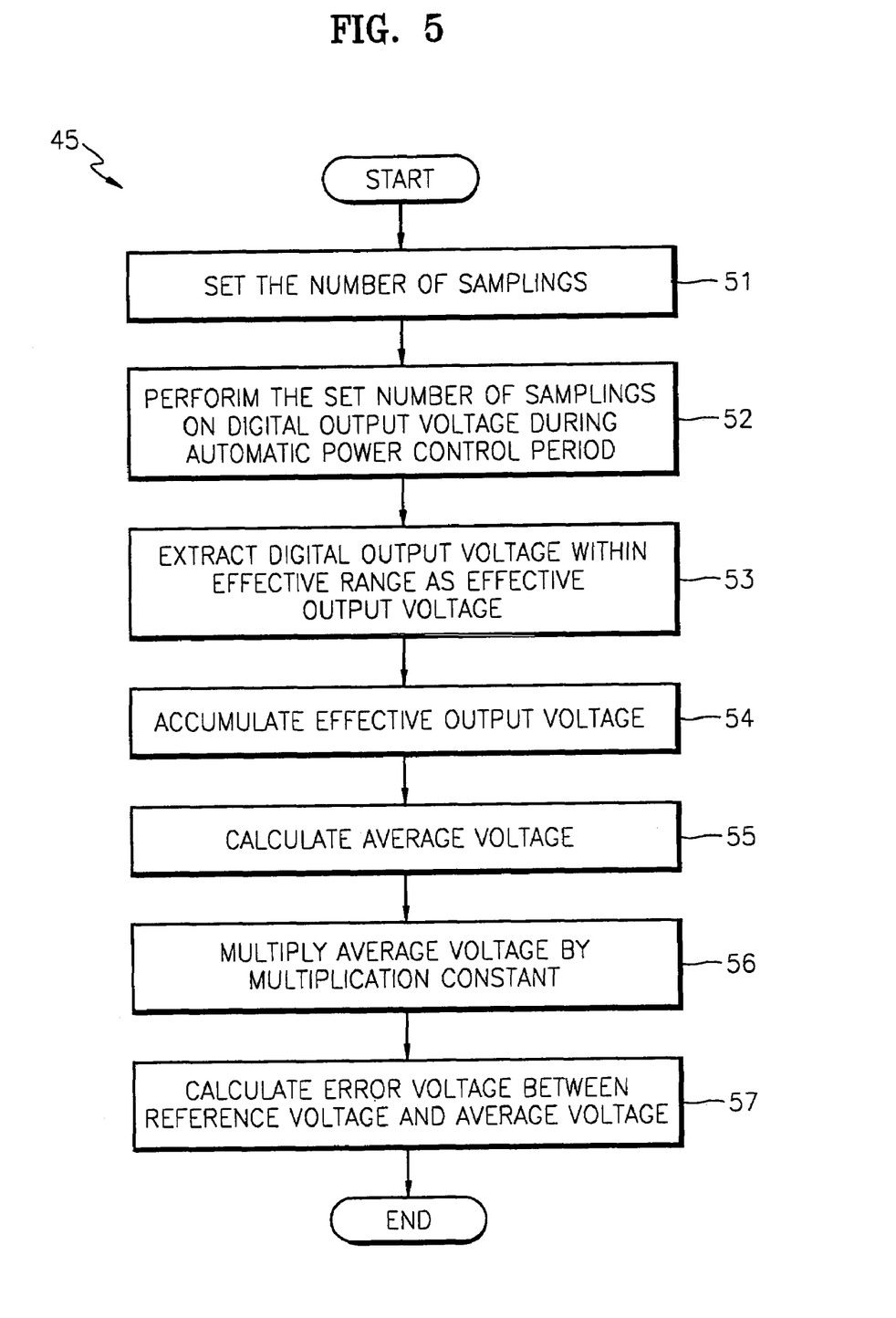
FIG. 5 is a detailed flowchart of a procedure to extract an error voltage in the method shown in FIG. 4.

Referring to FIG. 5, the number of samplings or a sampling rate during the automatic power control period of operation 41 is set in operation 51. According to an aspect of the present invention, operation 51 may be selectively performed when necessary.

At operation 52, the set number of samplings is performed on the digital output voltage obtained in operation 43 during the automatic power control period. Each sampled digital output voltage is compared with the first maximum and the first minimum, which are the upper and lower limits of an effective range previously set, and, at operation 53, the digital output voltage within the effective range is extracted as the effective output voltage.

At operation 54, the effective output voltage is accumulated. At operation 55, the average effective output voltage is calculated. At operation 57, the error voltage between the average effective output voltage and the predetermined reference voltage is generated. Here, at operation 56, in order to simplify decimal point calculation, the average effective output voltage may be multiplied by a predetermined multiplication constant Km.

Referring back to FIG. 4, at operation 47, the proportional-integral processing is performed on the error voltage generated in operation 45 to generate the compensated control voltage, and the effective control voltage is generated from the compensated control voltage. Operation 47 will be described in detail with reference to FIG. 6.

Figure 6:
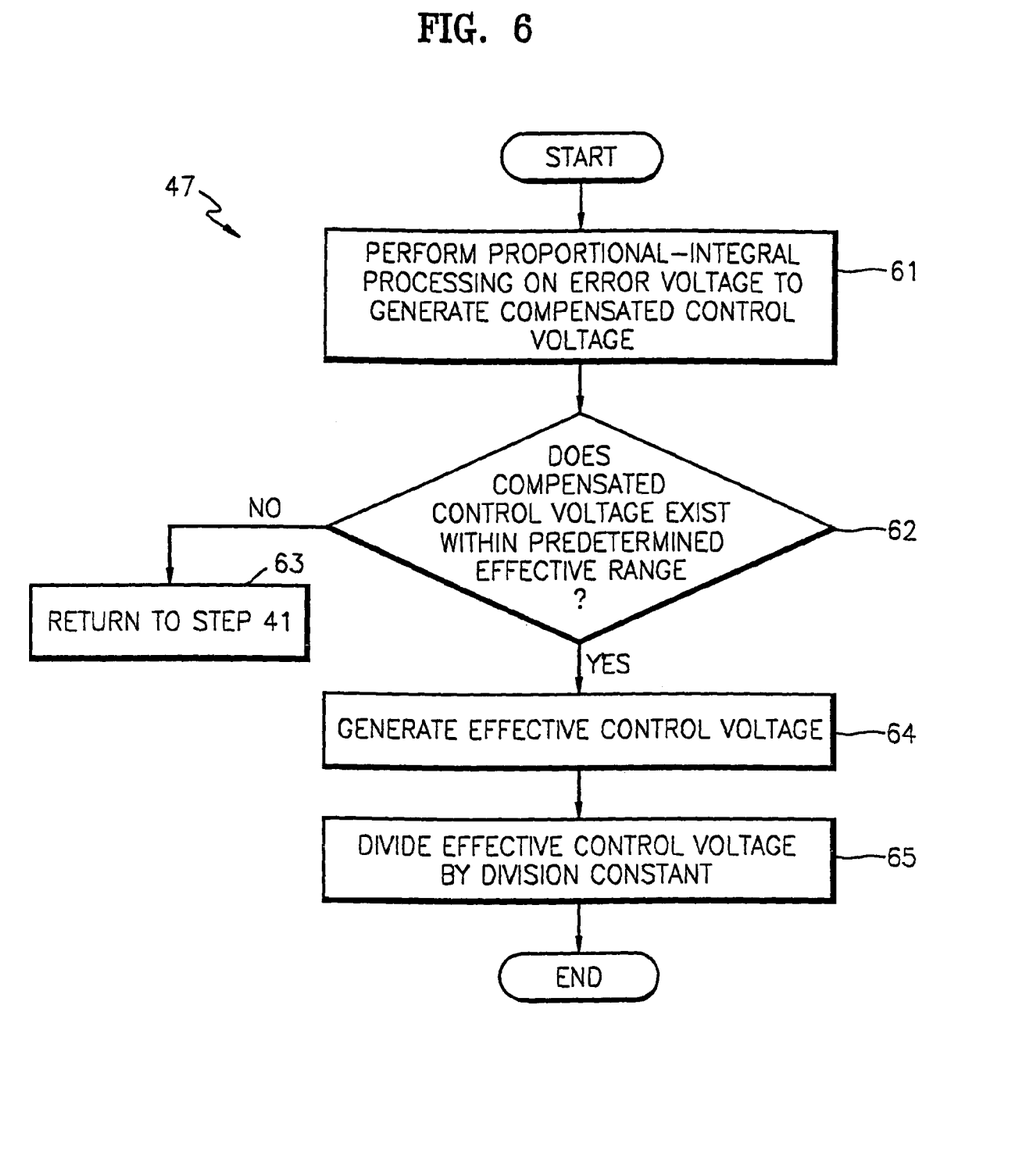
FIG. 6 is a detailed flowchart of a procedure to extract a control voltage in the method shown in FIG. 4.

Referring to FIG. 6, at operation 61, the proportional-integral processing is performed on the error voltage generated in operation 45 using the proportional constant Kp and the integral constant Ki to generate a compensated control voltage.

The compensated control voltage is compared with the second maximum and the second minimum, which are the upper and lower limit of the predetermined effective range, to determine, at operation 62, whether the compensated control voltage exists within the effective range. If the method determines that the compensated control voltage does not exist within the effective range, the method returns back to operation 41 to be performed with respect to the next automatic power control period.

Conversely, if the method determines that the compensated control voltage exists within the effective range, at operation 64, the compensated control voltage is generated as an effective control voltage. In the meantime, at operation 65, in the case where the multiplication constant Km is used during the generation of the error voltage, the effective control voltage is divided by a division constant Kd.

Referring back to FIG. 4 again, at operation 49, the effective control voltage is converted from the digital form to the analog form and then applied to the laser diode 25.

The above-described invention may be embodied as a computer readable program code or may be embodied in a general purpose digital computer by running such a program from a computer readable medium, including but not limited to storage media such as magnetic storage media (e.g., ROM's, floppy disks, hard disks, etc.), optically readable media (e.g., CD-ROMs, DVDs, etc.) and carrier waves (e.g., transmissions over the Internet).

As described above, according to an aspect of the present invention, among digital output voltages of a laser diode which are sampled during a predetermined automatic power control period, a digital output voltage within an effective range is extracted, and an error voltage between the extracted digital output voltage and a reference voltage is obtained. Next, among compensated control voltages obtained by performing proportional-integral processing on the error voltage, an effective control voltage within an effective range is extracted and used to control the output power of the laser diode. Therefore, according to an aspect of the present invention, the present invention guarantees that the output power of the laser diode is quickly stabilized at a target value even if an ambient temperature of the laser diode increases. In addition, according to an aspect of the present invention, an automatic power control module for the laser diode can be realized in a digital form and integrated into a printer controller, and a miniaturized, light, and inexpensive laser printers can be manufactured.

While this invention has been particularly shown and described with reference to various aspects thereof, it will be understood by those skilled in the art that various changes in form and details may be made therein without departing from the spirit and scope of the invention as defined by the appended claims. The preferred aspects should be considered in descriptive sense only and not for purposes of limitation. Therefore, the scope of the invention is defined not by the detailed description of the invention but by the appended claims, and all differences within the scope will be construed as being included in the present invention.

What is claimed is:

1. A method of automatically controlling an output power of a laser diode, the method comprising:
   generating an error voltage between an output voltage of the laser diode sampled during an automatic power control period and a reference voltage, the output voltage being an effective output voltage within a predetermined range; and
   performing proportional-integral processing on the error voltage to generate a compensated control voltage and applying the compensated control voltage to the laser diode,
   wherein the compensated control voltage applied to the laser diode is an effective control voltage within a predetermined range,
   wherein the generation of the error voltage comprises:
   sampling the output voltage of the laser diode during the automatic power control period;
   extracting the sampled output voltage that exists within a range between a first maximum and a first minimum as the effective output voltage;
   calculating an average effective output voltage; and
   generating the error voltage between the average effective output voltage and the reference voltage.

2. A method of automatically controlling an output power of a laser diode, the method comprising:
   setting an automatic power control period for the laser diode;
   converting an output voltage of the laser diode from an analog form to a digital form;
   generating an error voltage between a reference voltage and an effective output voltage within a predetermined range extracted from digital output voltages sampled during the automatic power control period;
   performing proportional-integral processing on the error voltage generate a compensated control voltage and generating an effective control voltage within a predetermined range using the compensated control voltage; and
   converting the effective control voltage from the digital form to the analog form,
   wherein the generation of the error voltage comprises:
   sampling the digital output voltage of the laser diode during the automatic power control period;
   extracting the sampled digital output voltage that exists within a range between a first maximum and a first minimum as the effective output voltage;
   calculating an average effective output voltage; and
   generating the error voltage between the average effective output voltage and the reference voltage.

3. The method of claim 2, wherein the performing of the proportional integral processing comprises:
   performing the proportional-integral processing on the error voltage to generate the compensated control voltage; and
   generating the compensated control voltage that exists within a range between a second maximum and a second minimum as the effective control voltage.

4. A computer readable medium having embodied thereon a computer program for automatically controlling an output power of a laser diode comprising:
   generating an error voltage between an output voltage of the laser diode sampled during an automatic power control period and a reference voltage, the output voltage being an effective output voltage within a predetermined range; and
   performing proportional-integral processing on the error voltage to generate a compensated control voltage and applying the compensated control voltage to the laser diode, wherein the compensated control voltage applied to the laser diode is an effective control voltage within a predetermined range,
   wherein the generation of the error voltage comprises:
   sampling the output voltage of the laser diode during the automatic power control period;
   extracting the sampled output voltage that exists within a range between a first maximum and a first minimum as the effective output voltage;
   calculating an average effective output voltage; and
   generating the error voltage between the average effective output voltage and the reference voltage.

5. A computer readable medium having embodied thereon a computer program for automatically controlling an output power of a laser diode, comprising:
   setting an automatic power control period for the laser diode;
   converting an output voltage of the laser diode from an analog form to a digital form;
   generating an error voltage between a reference voltage and an effective output voltage within a predetermined range extracted from digital output voltages sampled during the automatic power control period;
   performing proportional-integral processing on the error voltage to generate a compensated control voltage and generating an effective control voltage within a predetermined range using the compensated control voltage; and
   converting the effective control voltage from the digital form to the analog form,
   wherein the generation of the error voltage comprises;
   sampling the output voltage of the laser diode during the automatic power control period;
   extracting the sampled output voltage that exists within a range between a first maximum and a first minimum as the effective output voltage;
   calculating an average effective output voltage; and
   generating the error voltage between the average effective output voltage and the reference voltage.

6. An apparatus to automatically control an output power of a laser diode, the apparatus comprising:
   an error voltage generation unit generating an error voltage between an output voltage of the laser diode sampled during an automatic power control period and a reference voltage, the output voltage being an effective output voltage within a predetermined range; and
   a control voltage generation unit performing proportional-integral processing on the error voltage provided from the error voltage generation unit to generate an effective control voltage within a predetermined range, wherein the error voltage generation unit comprises:
an analog-to-digital converter converting the output voltage of the laser diode from an analog form to a digital form;
an effective output voltage extractor extracting an effective output voltage within a predetermined range from the digital output voltage provided from the analog-to-digital converter; and
a subtractor subtracting the reference voltage from the effective output voltage provided from the effective output voltage extractor to generate the error voltage; and
wherein the effective output voltage extractor comprises one of a first unit and a second unit,
wherein the first unit comprises:
a sampler sampling the digital output voltage provided from the analog-to- dig ital converter during the automatic power control period;
a comparator comparing the sampled output voltage with a first maximum and a first minimum, determining whether the sampled output voltage exists within an effective range defined by the first maximum and the first minimum, and extracting the effective output voltage within the effective range;
an accumulator accumulating the effective output voltage extracted by the comparator; and
a divider dividing the accumulated effective output voltage by a number of accumulations to obtain an average effective output voltage; and
wherein the second unit comprises:
a sampler controlling the analog-to-digital converter to perform conversion only during the automatic power control period;
a comparator comparing the output voltage provided from the sampler with a first maximum and a first minimum, determining whether the sampled output voltage exists within an effective range defined by the first maximum and the first minimum, and extracting the effective output voltage within the effective range;
an accumulator accumulating the effective output voltage extracted by the comparator; and
a divider dividing the accumulated effective output voltage by a number of accumulations to obtain an average effective output voltage.

7. The apparatus of claim 6, the first unit further comprising;
a multiplier multiplying an output of the divider by a predetermined multiplication constant.

8. The apparatus of claim 6, the second unit further comprising:
a multiplier multiplying an output of the divider by a predetermined multiplication constant.

9. The apparatus of claim 6, wherein the control voltage generation unit comprises:
a proportional-integral processor performing proportional-integral processing on the error voltage provided from the error voltage generation unit using a predetermined proportional constant and a predetermined integral constant to generate a compensated control voltage;
an effective control voltage extractor extracting the effective control voltage from the compensated control voltage provided from the proportional-integral processor; and
a digital-to-analog converter converting the effective control voltage provided from the effective control voltage extractor to an analog form and applying the effective control voltage in the analog form to the laser diode.

10. The apparatus of claim 9, wherein the effective control voltage extractor compares the compensated control voltage with a second maximum and a second minimum, to define an effective range to determine whether the compensated control voltage exists within the effective range, and extracts the effective control voltage within the effective range.

11. The apparatus of claim 9, further comprising:
a divider dividing the effective control voltage provided from the effective control voltage extractor by a predetermined division constant.

12. A laser printer controller with a laser diode, comprising:
an engine processor module controlling an entire operation of a printer engine; and
an automatic power control module of the laser diode automatically controlling an output power of the laser diode positioned within a laser scanning unit by sampling an effective output voltage within a predetermined range from an output power of the laser diode during a automatic power control period and performing proportional-integral processing on an error voltage between the effective output voltage and a reference voltage, wherein the laser printer controller is structured in a single integrated circuit,
wherein the automatic power control module of the laser diode comprises:
an analog-to-digital converter converting the output voltage of the laser diode from an analog form to a digital form;
an error voltage generation unit generating an error voltage between a reference voltage and the effective output voltage, which is selected from digital output voltages extracted during the automatic power control period;
a control voltage generation unit performing the proportional-integral processing on the effective output voltage to generate a compensated control voltage and generating an effective control voltage using the compensated control voltage; and
a digital-to-analog converter converting the effective control voltage from the digital form to the analog form.

13. A printer controller controlling a laser diode and connected to a printer engine, comprising:
an engine processor module controlling an operation of the printer engine; and
an automatic power control module automatically controlling an output power of the laser diode by generating an error voltage between an output voltage of the laser diode sampled during an automatic power control period and a reference voltage, the output voltage being an effective output voltage within a predetermined range, and performing proportional-integral processing on the error voltage to generate a compensated control voltage and applying the compensated control voltage to the laser diode,
wherein the automatic power control module comprises:
an error voltage generation unit generating the error voltage between the output voltage of the laser diode, which is extracted for a duration of the automatic power control period, and the reference voltage, AND
wherein the error voltage generation unit comprises:
an analog-to-digital converter converting a voltage of the output power of the laser diode to a digital output voltage;
a sampler sampling the digital output voltage from the analog-to-digital converter during the automatic power control period; and a first comparator setting a first maximum and a first minimum to define an effective range of the digital output voltage of the laser diode, comparing the first maximum and the first minimum with the sampled digital output voltage received from the sampler, determining whether the sampled digital output voltage exists within the effective range, and outputting an effective output voltage.

14. The printer controller of claim 13, wherein the error voltage generation unit further comprises:
an accumulator accumulating the effective output voltage; and
a first divider dividing an accumulated result output from the accumulator by a number of accumulations to calculate an average effective output voltage.

15. The printer controller of claim 14, wherein the error voltage generation unit further comprises:
a multiplier multiplying the average effective output voltage by a predetermined multiplication constant Km to simplify a decimal point calculation in the proportional-integral processing and outputting a multiplied result; and
a subtracter subtracting the reference voltage from the multiplied result to generate an error voltage.

16. The printer controller of claim 14, wherein the sampler sets the automatic power control period and controls the analog-to-digital converter to perform the conversion of the voltage of the output power only during the automatic power control period.

17. The printer controller of claim 14, wherein the sampler sets a number of samplings during the automatic power control period.

18. The printer controller of claim 15, wherein the automatic power control module further comprises a control voltage generation unit comprising:
a proportional section multiplying the error voltage by a proportional constant Kp to generate a proportional term;
an integral section accumulating the error voltage and multiplying the accumulated error voltage by an integral constant Ki to generate an integral term; and
an adder adding the proportional term and the integral term and outputting a result of the addition.

19. The printer controller of claim 18, wherein the control voltage generation unit further comprises:
a second comparator setting a second maximum and a second minimum to define an effective range of a control voltage for the laser diode, comparing the proportional-integral processed error voltage with the second maximum and the second minimum, and determining whether the control voltage exists within the effective range,
a second divider receiving an effective control voltage within the effective range, wherein when the control voltage is beyond the effective range, the control voltage is ignored, and the second comparator waits until another control voltage obtained during a next automatic power control period is received from the proportional-integral processor,
a switch switching the output of the effective control voltage provided from the second divider, and
a digital-to-analog converter converting the effective control voltage provided from the switch to an analog form and applies the converted effective control voltage to the laser diode.

20. The printer controller of claim 19, wherein the second divider divides the effective control voltage received from the second comparator by a division constant Kd and outputs the divided effective control voltage to the switch.

21. The printer controller of claim 20, wherein the division constant Kd is the same as the multiplication constant Km.

22. The printer controller of claim 18, wherein, the error voltage generation unit further comprises a multiplier and the control voltage generation unit further comprises a second divider to simplify a decimal point calculation.

23. The printer controller of claim 19, wherein when the control voltage is beyond the effective range, the control voltage is ignored, and the second comparator waits until another control voltage obtained during a next automatic power control period from the proportional-integral processing.

24. A method of a printer controller controlling a laser diode and connected to a printer engine, the method comprising:
controlling an operation of the printer engine;
automatically controlling an output power of the laser diode by generating an error voltage between an output voltage of the laser diode sampled during an automatic power control period and a reference voltage, the output voltage being an effective output voltage within a predetermined range; and
performing proportional-integral processing on the error voltage to generate a compensated control voltage and applying the compensated control voltage to the laser diode,
wherein the compensated control voltage applied to the laser diode is an effective control voltage within a predetermined range,
wherein the generation of the error voltage comprises:
sampling the output voltage of the laser diode during the automatic power control period;
extracting the sampled output voltage that exists within a range between a first maximum and a first minimum as the effective output voltage;
calculating an average effective output voltage; and
generating the error voltage between the average effective output voltage and the reference voltage.

25. A computer readable medium having embodied thereon a computer program for automatically controlling an output power of a laser diode, comprising:
controlling an operation of the printer engine;
automatically controlling an output power of the laser diode by generating an error voltage between an output voltage of the laser diode sampled during an automatic power control period and a reference voltage, the output voltage being an effective output voltage within a predetermined range; and
performing proportional-integral processing on the error voltage to generate a compensated control voltage and applying the compensated control voltage to the laser diode,
wherein the compensated control voltage applied to the laser diode is an effective control voltage within a predetermined range,
wherein the generation of the error voltage comprises:
sampling the output voltage of the laser diode during the automatic power control period;
extracting the sampled output voltage that exists within a range between a first maximum and a first minimum as the effective output voltage;
calculating an average effective output voltage; and
generating the error voltage between the average effective output voltage and the reference voltage.

* * * * *

UNITED STATES PATENT AND TRADEMARK OFFICE
CERTIFICATE OF CORRECTION

PATENT NO. : 7,492,796 B2
APPLICATION NO. : 10/646923
DATED : February 17, 2009
INVENTOR(S) : Hong-gie Hwang It is certified that error appears in the above-identified patent and that said Letters Patent is hereby corrected as shown below:

Column 8, Line 48, change "comprises;" to --comprises:--.

Column 9, Line 16, change "dig ital" to --digital--.

Column 10, Line 59, change "AND" to --and--.

Column 11, Line 23, change "subtracter" to --subtractor--.

Signed and Sealed this

Twelfth Day of May, 2009

JOHN DOLL
*Acting Director of the United States Patent and Trademark Office*